United States Patent
Diana

(10) Patent No.: US 9,757,775 B2
(45) Date of Patent: Sep. 12, 2017

(54) CHAMBER CLEANING METHOD USING F$_2$ AND A PROCESS FOR MANUFACTURE OF F$_2$ FOR THIS METHOD

(71) Applicant: SOLVAY SA, Brussels (BE)

(72) Inventor: Oliviero Diana, Vilvoorde (BE)

(73) Assignee: SOLVAY SA, Brussels (BE)

( * ) Notice: Subject to any disclaimer, the term of this patent is extended or adjusted under 35 U.S.C. 154(b) by 0 days.

(21) Appl. No.: 14/426,510

(22) PCT Filed: Sep. 6, 2013

(86) PCT No.: PCT/EP2013/068437
§ 371 (c)(1),
(2) Date: Mar. 6, 2015

(87) PCT Pub. No.: WO2014/037485
PCT Pub. Date: Mar. 13, 2014

(65) Prior Publication Data
US 2015/0209838 A1  Jul. 30, 2015

(30) Foreign Application Priority Data
Sep. 10, 2012  (EP) ..................................... 12183649

(51) Int. Cl.
*C23G 1/36* (2006.01)
*B08B 9/00* (2006.01)
(Continued)

(52) U.S. Cl.
CPC ............ *B08B 5/00* (2013.01); *C23C 16/4405* (2013.01); *C25B 1/245* (2013.01); *C25B 15/08* (2013.01); *Y02P 20/123* (2015.11)

(58) Field of Classification Search
None
See application file for complete search history.

(56) References Cited

U.S. PATENT DOCUMENTS 5,362,469 A    11/1994  Seseke-Koyro et al.
5,585,085 A    12/1996  Seseke-Koyro et al.
(Continued)

FOREIGN PATENT DOCUMENTS

JP          3 293726 A    12/1991
WO      2011/117234 A2     9/2011
(Continued)

OTHER PUBLICATIONS

JP 3 293726 English Translation, accessed on Mar. 2016.*

*Primary Examiner* — Eric Golightly
*Assistant Examiner* — Arlyn I Rivera-Cordero

(57) ABSTRACT

Elemental fluorine is often manufactured electrochemically from a solution of KF in hydrogen fluoride and contains varying amounts of HF as impurity. The present invention provides a method for chamber cleaning using F$_2$ which contains more than 0.1% by weight and equal to or less than 10% by weight of HF. Surprisingly, such an F$_2$ is very well suited for the purpose of chamber cleaning. In a preferred embodiment, the F$_2$ which contains more than 0.1% by weight and less than 2.5% by weight of HF is electrolytically produced, cleaned, delivered and used on site, without any pressurizing treatment. Omitting cleaning steps and process and using process conditions leaving a relatively high HF content in the F$_2$ allows at the same time to omit pressurizing steps. The advantage is that less cleaning steps.

9 Claims, 1 Drawing Sheet

(51) Int. Cl.
    *B08B 3/00*    (2006.01)
    *B08B 5/00*    (2006.01)
    *C23C 16/44*   (2006.01)
    *C25B 1/24*    (2006.01)
    *C25B 15/08*   (2006.01)

(56) References Cited

U.S. PATENT DOCUMENTS

| | | | |
|---|---|---|---|
| 5,688,384 A * | 11/1997 | Hodgson | C25B 1/245 |
| | | | 204/228.2 |
| 6,602,433 B1 | 8/2003 | Bhardwaj et al. | |
| 2011/0088718 A1* | 4/2011 | Torres, Jr. | B08B 7/0035 |
| | | | 134/1.1 |
| 2013/0012027 A1 | 1/2013 | Paganin | |
| 2013/0130505 A1 | 5/2013 | Diana et al. | |
| 2013/0175161 A1 | 7/2013 | Morelle et al. | |

FOREIGN PATENT DOCUMENTS

| | | |
|---|---|---|
| WO | 2012/016997 A1 | 2/2012 |
| WO | 2012/034978 A1 | 3/2012 |

* cited by examiner

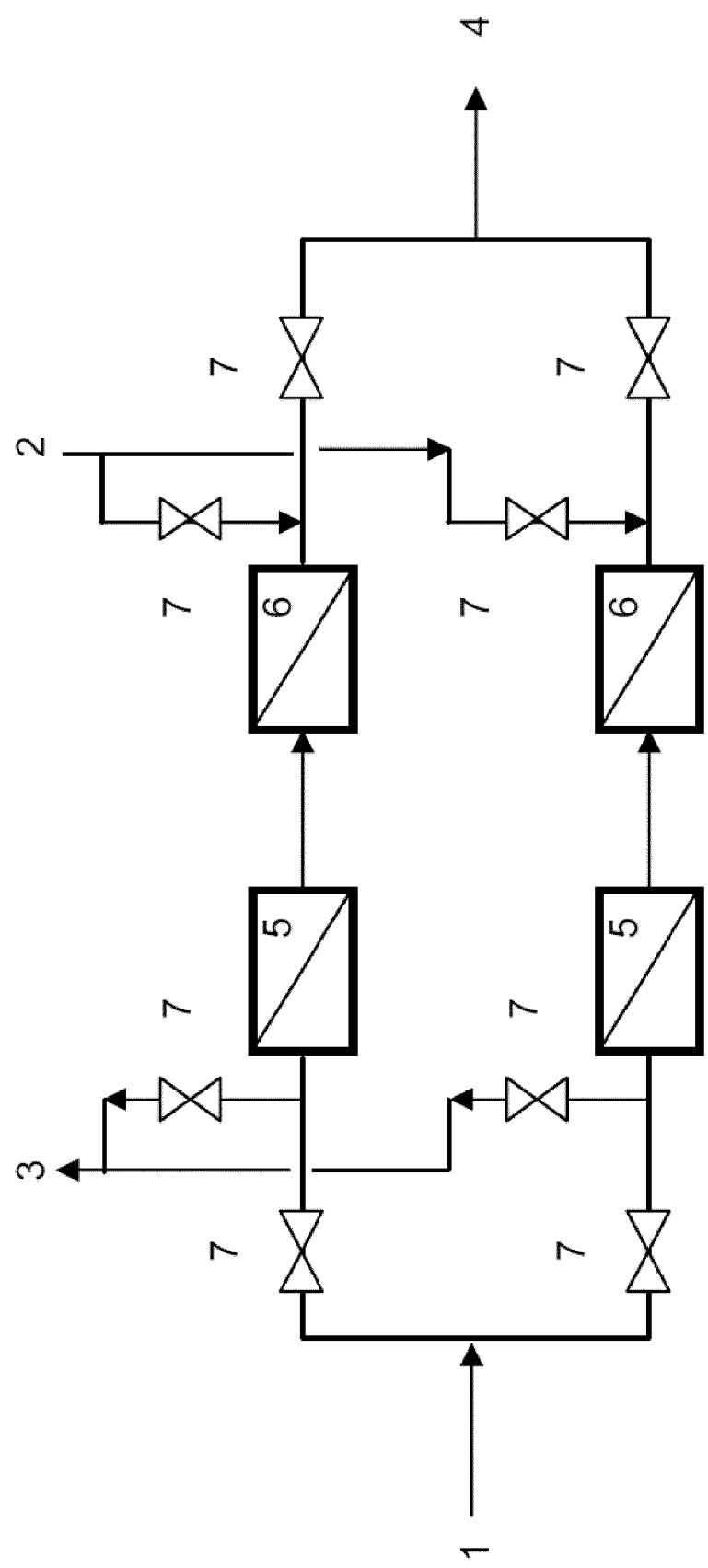

CHAMBER CLEANING METHOD USING $F_2$ AND A PROCESS FOR MANUFACTURE OF $F_2$ FOR THIS METHOD

This application is a U.S. national phase entry under 35 U.S.C. §371 of International Application No. PCT/EP2013/068437, filed on Sep. 6, 2013, which claims priority to European Application No. 12183649.8, filed on Sep. 10, 2012. The entire contents of these applications are being incorporated herein by reference for all purposes.

The invention concerns a chamber cleaning method using $F_2$ with a specific content of HF and a process for manufacture of $F_2$ for this method.

$F_2$ (elemental fluorine) is used, i.a., as an etching agent and as a cleaning agent for cleaning of chambers used in the manufacture of semiconductors, micro-electromechanical devices, solar cells, TFTs (thin film transistors). HF was considered as undesirable component in $F_2$ intended for etching or chamber cleaning WO 2012/016997 for example provides a purification process for the manufacture of highly pure $F_2$, useful as etching agent and chamber cleaning agent, with a content of equal to or less than 10 ppm of HF.

$F_2$ is often manufactured by the electrolysis of hydrogen fluoride (HF) in the presence of molten/dissolved fluoride salts; especially adducts of HF and KF having a formula of about $KF \cdot (1.8-2.3)HF$ are electrolyzed. Often, production of $F_2$ for chamber cleaning is performed on site, i.e. on the premises of the point of use.

Object of the present invention is to provide a technically and economically advantageous method of chamber cleaning wherein $F_2$ is used as chamber cleaning agent and a technically and economically advantageous process for providing $F_2$ suitable for chamber cleaning.

These objects and other objects as apparent from the description and the claims are achieved by the present invention.

Consequently, one aspect of the present invention concerns a method for the cleaning of chambers using elemental fluorine which contains equal to or more than 0.01% by weight, preferably equal to or more than 0.1% by weight, of HF, and equal to or less than 10% by weight, preferably equal to or less than less than 5% by weight, and more preferably, equal to or less than 2.5% by weight of HF, and most preferably, equal to or less than 2% by weight of HF.

It was observed that $F_2$ which comprises more than 0.1% by weight of HF is very suitable as agent for chamber cleaning.

More preferably, the content of HF in the $F_2$ is equal to or greater than 0.5% by weight. Especially preferably, it is equal to or lower than 2% by weight. It is especially preferred to apply $F_2$ with a content of equal to or more than 1% by weight of HF, and a content of equal to or less than 2% by weight of HF.

The chambers which can be cleaned are preferably those used in the manufacture of semiconductors, micro-electromechanical devices, solar cells, TFTs (thin film transistors). In such chambers, items are treated according to known processes. For example, layers of Si, $SiO_2$, silicon nitride, silicon oxynitride, metals, metal oxides, carbon-fluorine polymers are formed on the items, e.g. according to plasma enhanced (PECVD) processes, and partially etched away in other treatment steps. During these processes, layers do not only form on the items but also undesired on parts in the chamber, e.g. construction parts, lines, shower heads or the walls. The method of the invention serves to clean the chambers from such undesired deposits.

The technical parameters of chamber cleaning are known to the expert in the art.

The chamber cleaning method of the present invention can be performed thermally or supported by an in-situ plasma and/or by a remote plasma.

While the pressure is very variable, e.g., may be equal to or lower than ambient pressure or greater than ambient pressure, it is preferably lower than ambient pressure for reasons explained below. The temperature during a thermal chamber cleaning is preferably equal to or greater than 400° C. In plasma-supported chamber cleaning, the temperature inside the chamber may often be greater than 100° C.

While any source for $F_2$ comprising HF as outlined above may be used as chamber cleaning agent in the present invention, preferably $F_2$ is applied which is produced in one or more electrolytic cells and which is purified as explained further below.

The plant for $F_2$ manufacture may preferably be located on site of the plant having chambers of which are to be purified. If desired, however, the $F_2$ may be produced remote from the point of use and be transported from the location of its manufacture to its point of use.

According to a preferred embodiment, the method for chamber cleaning comprises at least two steps:

(I) a step of providing $F_2$ comprising equal to or more than 0.01% by weight, preferably equal to or more than 0.1% by weight, and equal to or less than 10% by weight, preferably equal to or less than 5% by weight, and especially preferably, equal to or less than 2.5% by weight of HF; and (II) a step of chamber cleaning using the $F_2$ from step 1.

While, as mentioned above, any $F_2$ with the HF content given above may be use in step (II), preferably, the chamber cleaning step (II) is performed using an $F_2$ with the HF content as indicated above which HF was manufactured in step (I) in the specific way as described below.

In the following, a preferred embodiment of providing $F_2$ according to step (I) is described. This preferred embodiment of step (I) as described now is a separate aspect of the present invention.

The preferred embodiment of step (I) concerns a process for the manufacture of $F_2$ comprising more than 0.1% by weight and equal to or less than 2.5% by weight of HF, and this process comprises:

A) at least one step of electrolytically producing raw $F_2$ from HF in the presence of KF B) at least one step of removing particles entrained in the raw $F_2$ obtained in step A)

C) at least one step of filtering any remaining particles out of the $F_2$ leaving step B)

and

D) a step of delivering the $F_2$ to a buffer tank or a storage tank.

The flow of $F_2$ can be measured, for example, with a flow indicator, for example, a flow indicator operating according the Coriolis type which is very accurate.

Step A) usually is performed by electrolysis of HF in the presence of an electrolyte salt, especially in the presence of KF.

Step B) may be performed by contacting the raw $F_2$ from step B) with liquid HF, e.g. by passing the raw $F_2$ through liquid HF, in a static scrubber or in a jet scrubber.

The scrubber can be operated in large range of temperatures; it may be composed of multiple stages; two or more scrubbers can be arranged in parallel and/or in series; and each of these scrubbers can be operated at different pressures and/or different temperatures. The temperature of the scrubber or each of the scrubbers, if there are more scrubbers than one, can vary between −200° C. and +20° C. Preferably, the temperature of the scrubber or each of scrubbers is equal to or higher than −150° C., and more preferably, it is equal to or higher than −82° C. Preferably, the temperature of the scrubber or each of the scrubbers, if there are more scrubbers than one, is equal to or lower than −50° C. A preferred temperature range for the scrubber or each of the scrubbers, if more than one scrubbers are in use, is from −150° C. to −20° C.; an especially preferred range is from −80° C. to −50° C. Depending especially on the number, temperature and the pressure of the scrubber or scrubbers, the amount of HF which is removed from the $F_2$, will vary. For example, at a higher pressure, at a lower temperature in the scrubber or scrubbers, and if several scrubbers are assembled in series, the amount of HF removed can be almost completely, such that only a few ppm are left in the treated $F_2$. If the temperature is in the upper region of the range given above, at a lower pressure and only one scrubber to be passed, the amount of removed HF is low, and the $F_2$ after treatment may comprise almost all of the HF entrained. Nevertheless, the advantage of scrubbers, namely to remove solids, still will be achieved.

Step C) may be performed by passing the $F_2$ withdrawn from step B) through a filter made from suitably resistant material, e.g. made from Monel metal. The pore size may be equal to or smaller than 100 μm, preferably equal to or smaller than 20 μm. A suitable pore size range is 1 to 20 μm. Preferably, the pore size is equal to or greater than 0.001 μm. A preferred range is from 0.001 to 20 μm.

According to step D), the $F_2$ withdrawn from step A), step B), step C) may be stored in an optional buffer tank. Preferably, the $F_2$ is stored in a sufficiently large buffer tank before its delivery to the point of use for the step of chamber cleaning. Alternatively, it is directly delivered according to step (II) to the point of use for chamber cleaning, if desired, through an additional filter.

Another preferred embodiment of step (I) concerns a process for the manufacture of $F_2$ comprising equal to or more than 2% by weight and equal to or less than 10% by weight of HF, preferably equal to or more than 4% by weight and equal to or less than 8% by weight of HF and this process comprises:

A) at least one step of electrolytically producing raw $F_2$ from HF in the presence of KF
B) at least one step of removing particles entrained in the raw $F_2$ obtained in step A) and
C) at least one step of filtering remaining particles out of the $F_2$ leaving step B).

Step A) and C) are usually performed as described above. Step B) in this embodiment is usually a mechanical separation of particles, e.g. by means of a settling box.

This embodiment is particularly advantageous in that it is possible to produce $F_2$ gas suitable for use according to the method according to the invention without purification steps requiring cooling of the gas or washing of the gas with HF.

In the process according to the invention, it may be useful to have available two or three filtering devices for filtering the $F_2$ stream which can suitably be operated in alternating mode. This allows to ensure continuous operation of the $F_2$ manufacture. A particularly suitable filtering device comprises a first filter having relatively wider pore size (e.g. from 5-50 μm) and a second filter having relatively narrower pore size (e.g. from 0.001 to 0.005 μm). In this case the $F_2$ gas to be purified from particles is first passed through the first filter and thereafter through the second filter.

It has also been found that it is particularly advantageous to clean the filters used in the present invention with liquid HF, thereby removing from the filter particles filtered off. The cleaning operation is generally carried out when the filter is not in use to remove particles from the $F_2$ stream. The cleaning HF recovered from this step can suitably be fed to a step of electrolytically producing $F_2$. In that case the cleaning HF is suitably fed to the electrolytic step in liquid form.

In a particular aspect, when the $F_2$ manufacturing plant comprises a plurality of cells, the $F_2$ gas streams may be combined and filtered through a single filtering device (and optional additional filtering devices for operation in alternating mode).

FIG. 1 shows a schematic representation of an illustrative plant suitable for providing $F_2$ for use in the processes and methods according to the invention. The invention also concerns the said plant for $F_2$ manufacture. Raw $F_2$ is produced in electrolytic cells and supplied through line (1) to a filtering device having a plurality of filter sets (two shown in the FIGURE) composed of a first filter having relatively wider pore size (5) and a second filter having relatively narrower pore size (6). The filter sets can be operated in alternating mode by shutting or opening valves (7) placed in the respective lines. $F_2$ purified from particles and containing HF as described above is supplied through line (4) to a point of use, in particular for chamber cleaning, possibly after passing through a buffer tank. When appropriate, liquid HF is supplied through line (2) controlled by a valve (7) to the filter set to clean the filters (5) and (6). HF recovered from the cleaning of filters (5) and (6) can be withdrawn through line (3) controlled by a valve (7) and fed to the electrolytic cell for $F_2$ manufacture.

There are two particular alternatives to perform the process of $F_2$ manufacture and the method of chamber cleaning of the invention.

According to a first alternative, $F_2$ is provided which comprises HF in the concentration as indicated above, namely more than 0.1% by weight and less than 2.5% by weight of HF or in preferred concentrations as given above; said $F_2$ is subjected to a pressurizing treatment, e.g. in a compressor or a pump, and thus, it is delivered to the point of use at a pressure greater than in the electrolytic cell, i.e. usually it is delivered with a pressure of greater than 1 bar (abs). Often, in this first alternative, it is delivered at a pressure which is equal to or greater than 2 bar (abs) and equal to or lower than 10 bar (abs.). The advantage of this alternative is, for example, that smaller storage tanks may be utilized; the disadvantage is that pumps or compressors must be provided which always impart additional risks of escaping $F_2$ or machine failure. Additionally, being at relatively high pressure, $F_2$ might escape from the lines and apparatus and thus, might pose a safety risk. Thus, this alternative is not the preferred one.

According to the second alternative which is the preferred one, the $F_2$ is delivered from its generation to the point of use without being subjected to any pressurizing treatment.

The expert is aware that $F_2$ and $H_2$, when getting into contact, may react in the form of heavy explosions. Thus, the $F_2$ compartments in an electrolytic cell are separated by so-called "shirts" from the $H_2$ compartments.

To avoid any risk of contact between $F_2$ and $H_2$, it is preferred that the pressure in the electrolytic cell both on the $F_2$ and $H_2$ side does not oscillate over a too high range; often, it is preferred to keep the cell pressure within ±0.01 to ±0.05 bar of a preset value. The pressure in the cell may be from 1 bar (abs) to 2 bar (abs) and even higher, up to 6 bar (abs). But to be on a safe side in view of the control of pressure oscillation which is easier at lower pressures, often, a pressure in the electrolytic cell in the range of from 1 to 1.1 bar (abs) is preferred.

The $F_2$ is especially preferably generated in the electrolytic cell at a pressure of approximately 1.05±0.02 bar (abs) and forwarded, via several steps to the point of use as chamber cleaning agent, having a pressure below 1 bar (abs), preferably having a pressure in the range from equal to or greater than 0.2 bar (abs) to equal to or lower than 0.55 bar (abs).

The second alternative will now be explained in detail. According to this preferred embodiment, the $F_2$ is not pressurized from step A) through step B), step C), including the delivery to the point of use in step D). If a buffer tank is applied, the $F_2$ is not pressurized in the buffer tank, too. This means that the driving force passing the $F_2$ from step A) to the final point of use is the pressure of approximately 1 to 1.1 bar (abs) in the electrolytic cell compartment in which the raw $F_2$ is generated.

In the preferred embodiment of the inventive process of $F_2$ manufacture which will now be described, the production, purification, the optional storage, and the delivery of $F_2$ containing more than 0.1% by weight and less than 2.5% by weight of HF to the point of use are well matched to each other such that at the point of use, $F_2$ is provided to the chamber or chambers to be cleaned with a pressure which is lower than ambient pressure. Preferably in this preferred embodiment, the content of HF in the $F_2$ is preferably equal to or greater than 0.5% by weight. Preferably, it is equal to or lower than 2% by weight; and the pressure of the $F_2$ in the line to the chamber or chambers to be cleaned, i.e. at the point of use, preferably is 0.2 to 0.55 bar (abs).

Especially preferably, the pressure of the $F_2$ at the point of use is from equal to or greater than 0.2 to equal to or lower than 0.55 bar (abs.), and the concentration of HF is from equal to or greater than 0.5% by weight to equal to or lower than 2% by weight, and more preferably, from equal to or greater than 1% by weight to equal to or lower than 2% by weight.

As will be described below, a preferred embodiment of the invention provides $F_2$ in step A) by electrolytic generation from a molten electrolyte salt having the formula KF·(1.8–2.3)HF, passing the raw $F_2$ in step B) through a static scrubber to contact it with liquid HF, passing the $F_2$ then in step C) through a filter to remove remaining solids, and, in step D), storing the $F_2$ in a buffer tank and passing the $F_2$ from the buffer tank to the point of use as chamber cleaning gas. If desired, the $F_2$ can be passed to the point of use via a flow indicator, e.g. a flow indicator operating according to the Coriolis type.

To give an impression of the trend of the pressure in the different steps from electrolytic generation of $F_2$ to the delivery of the point of use for chamber cleaning, the estimated minimal and maximal pressure drop in each step is given in the following table 1. It has to be noted that in the following description, a method is further explained wherein the pressure in the electrolytic cell is 1.05 bar (abs) because this is the preferred embodiment. The absolute pressure (but essentially not the pressure drop) may also be higher if the cell is operated at a higher pressure of the $F_2$ compartment.

TABLE 1

Pressure drop in intermediate steps from $F_2$ generation to the point of use

| Part | Pressure Drop | |
|---|---|---|
| | Minimal [mbar] | Maximal [mbar] |
| Static HF scrubber | 40 | 80 |
| Filter for solids | 25 | 150 |
| Flow indicator | 5 | 50 |
| All piping | 20 | 50 |
| In total | 90 | 330 |

If, optionally, a solid trap for HF, especially a NaF tower, is provided, the minimum pressure drop for such an HF trap is estimated to be 10 mbar, the maximum pressure drop is estimated to be 150 mbar. Thus, in this case, the total pressure drop would be (90+10=) 100 mbar as minimum, and (330+150=) 480 mbar as maximum.

Under the assumption that the $F_2$ is generated in the electrolytic cell compartment having a pressure of 1.05 bar (abs), and under the assumption that it is desired to deliver the $F_2$ after its treatment with a pressure of from equal to or greater than 0.2 bar (abs) to equal to or lower than 0.55 bar (abs), and under the assumption that—in the absence of an NaF tower—the minimum pressure drop is 90 mbar, and the maximum pressure drop is 330 mbar, then the $F_2$ pressure must be reduced using control valves from 0.95 bar (abs) to 0.2 bar to 0.55 bar if a minimum pressure drop is observed, or from 0.72 bar (abs) to 0.2 bar to 0.55 bar if a maximum pressure drop is observed.

Of course, the actual pressure drop depends on the apparatus used, on the temperature, gas flow and other parameters. Thus, the values given above are only to help the expert to better understand the invention.

In the following, this preferred embodiment is explained in further detail.

PREFERRED EMBODIMENTS OF STEP A)

In step A), $F_2$ is produced electrolytically. Often, salt compositions of the approximate formula KF·(1.8–2.3)HF are applied. Such compositions have a melting point, depending on the composition, around 80° C. or above. Usually, an electrolyzer contains several electrolytic cells. Each cell often contains a multitude of anodes. Often, the cell vessel containing the molten salt serves as cathode, or separate electrodes. Fresh HF is supplied continuously or batch wise to the cell to replenish electrolyzed HF.

HF is electrolyzed to form $F_2$ and $H_2$ which are collected in separate cell compartments. $H_2$ may be dumped. The raw $F_2$ formed contains up to 10% by weight of HF, and possibly even more; the raw $F_2$ further contains entrained particles which are essentially constituted of solidified electrolyte salt.

In step A), the raw $F_2$ is withdrawn from the respective cell compartment having a pressure of equal to or greater than 1 bar (abs). Usually, the pressure of the raw $F_2$ in the $F_2$ compartments is approximately 1.05±0.05 bar (abs). Preferred embodiments of step B):

In step B), the raw $F_2$ is subjected to a purification treatment to separate all or a major part of solid impurities from the raw $F_2$. Preferably, the solid-removing treatment comprises at least one step of contacting the raw $F_2$ with cooled liquid HF in a static scrubber.

The liquid HF with which the raw $F_2$ is contacted has a low temperature and consequently a low vapor pressure. The temperature of the liquid HF during its purifying contact with the fluorine is equal to or higher than the melting point of the HF at the respective pressure in the static scrubber. Preferably, it is equal to or higher than −83° C., more preferably, it is equal to or higher than −82° C. It is preferably equal to or lower than −60° C. The temperature of the liquid HF is preferably in the range between −60° C. and −82° C. The HF can be cooled by cooling machines which provide a suitably cooled liquid to heat exchangers to keep the HF at the desired low temperature. In a preferred embodiment, the liquid HF in the scrubber is indirectly cooled by means of liquid $N_2$ which, when passing from the liquid to the gaseous state, provides the desired cooling effect.

The $F_2$ can be contacted with technical grade liquid HF. If desired, purified liquid HF can be applied.

Methods to purify HF, mainly to remove phosphorous compounds, sulfur compounds, arsenic compounds, metals, hydrocarbons and water are well known. See for example U.S. Pat. No. 5,362,469 and U.S. Pat. No. 5,585,085. According to U.S. Pat. No. 5,362,469, water, arsenic compounds, boron compounds, phosphorous compounds and sulfur compounds as well as carbon compounds and metal compounds are removed from HF by contacting liquefied hydrogen fluoride with lithium fluoride and elemental fluorine. The HF is then distilled to provide pure HF. According to U.S. Pat. No. 5,585,085, water and hydrocarbons are removed from HF by contacting it with elemental fluorine and subsequent distillation.

The raw $F_2$ from step A) may preferably be contacted with a purified liquid HF which is essentially free of at least phosphorous compounds, sulfur compounds and arsenic compounds. HF can be purified according to the process of U.S. Pat. No. 5,362,469 and then has a content of water of less than 1 ppm.

Often, it is sufficient to perform step B) only once to achieve a desired degree of solids removal. But if desired, the contact between $F_2$ and liquid HF can be repeated once, or even more often.

The raw $F_2$ is supplied to the static scrubber to be contacted with liquid HF under the pressure it has in the electrolytic cell compartment. No pump or compressor is used to raise the pressure of the raw $F_2$ withdrawn from the electrolytic cell compartment. Due to the marginal pressure loss in the line from the electrolytic cell compartment to the scrubber, the raw $F_2$ enters the scrubber with a pressure corresponding to the pressure in the electrolytic cell, i.e. 1.05±0.02 bar (abs).

Due to the low temperature of the liquid HF during its contact with fluorine, the vapor pressure of HF is very low. Thus, not only the content of entrained solids is reduced, but also entrained HF is removed. The $F_2$ after the contact with liquid HF contains more than 0.1% by weight and less than 2.5% by weight.

The liquid HF which is used in the purification step is preferably circulated or reused, optionally after regeneration, e.g. by a step of distillation, to remove any solids washed out from the raw fluorine as described above. The advantage is that any water initially present in the HF reacts with $F_2$ to form HF and $OF_2$; after some time, the water is consumed, and the fluorine to be purified will not be consumed by water in a side reaction, and the fluorine will not take up any $OF_2$ anymore because it is no longer formed.

The $F_2$ which leaves the static scrubber has a pressure which is, as a rule of thumb, approximately 40 to 80 mbar lower than upon entering the static scrubber. The HF content depends from several conditions, e.g. from the initial HF concentration, from the temperature of the liquid HF and from the contact time. The conditions of contact between the liquid HF and the $F_2$ are selected such that the HF content is in the range given above, and notably, in the preferred ranges.

PREFERRED EMBODIMENTS OF STEP C)

The $F_2$ withdrawn from step B) is then treated in step C). Once again, no pump or compressor is used to raise the pressure of the $F_2$ withdrawn from step B) and forwarded to step C). For solids removal, the $F_2$ is passed in step C) through one or more particle filters with small pores to remove any residual solids content. The filter or filters may comprise pores in the range of 0.01 to 20 µm. Pore size denotes the pore diameter. Particle filters with a pore size greater than 20 µm could be applied but may not be effective enough. The particle filters serve to remove any solid particles before the contact with liquid HF, or to remove solids still entrained after the purifying treatment of the present invention; the particle filters may be constructed from materials resistant to $F_2$, especially from steel or Monel metal.

The temperature in the filter should advantageously be lower than the melting point of the solids (which is usually somewhat above 80° C.). Preferably, the temperature in the filter is equal to or lower than 50° C. Especially preferably, step C) is performed at ambient pressure.

The $F_2$ leaving the filter in step C) has a pressure which is approximately 10 to 150 mbar lower than upon entering the filter.

$F_2$ having passed steps B) and C) is suitably pure to be used as cleaning agent for chambers used for CVD-enhanced deposition of matter on items. It is especially suitable for cleaning of chambers which have been used for deposition and/or etching of layers, like CVD chambers, used in the manufacture of semiconductors, micro-electromechanical devices, solar cells, TFTs (thin film transistors).

PREFERRED EMBODIMENTS OF STEP D)

The $F_2$ leaving step C) is subjected to step D). In step D), it is delivered to the point of use, i.e. a chamber or a plurality of chambers to be cleaned. No pressurization is performed, thus it is not passed through a pump or a compressor.

Preferably, in step D), the $F_2$ leaving step C) is stored in a storage tank. In the storage tank, it is preferably stored at the pressure with which it is withdrawn from step C). If desired, a control valve may be applied to reduce the $F_2$ pressure in the buffer tank. In the buffer tank, the $F_2$ pressure preferably is in a range from equal to or greater than 0.2 bar (abs) to 0.8 bar (abs). In view of this relatively low pressure, the buffer tank or tanks may require a large internal volume. For example, one or more buffer tanks having an internal volume from 10 to 50 m³ are preferred. Using two or more buffer tanks, e.g. 4 buffer tanks, having an internal volume of 25 m³ provides sufficient capacity to provide a reliable $F_2$ delivery.

Preferably, the chamber cleaning method of the invention is performed such that step A) is performed in an electrolyzer, step B) is performed in a static scrubber, step C) is performed using a metallic filter, step D) is performed in a buffer tank or storage tank, and the $F_2$ leaving step D) is delivered to at least one chamber and used in the chamber in a chamber cleaning step (II), wherein the electrolyzer, the static scrubber, the metallic filter, the buffer tank or storage tank and the at least one chamber are operably connected.

Preferably, the pressure of the $F_2$ in each of the steps B) to D) and in step (II) is lower than the pressure of $F_2$ in the preceding step. Preferably, the $F_2$ pressure in step A) is equal to or lower than 1.1 bar (abs), preferably equal to or lower than 1.05±0.02 bar (abs), and preferably, the $F_2$ is delivered to the chamber in step (II) at a pressure from equal to or greater than 0.2 bar (abs) to equal to or lower than 0.55 bar (abs).

Another aspect, as mentioned above, concerns process for the manufacture of $F_2$ which contains more than 0.1% by weight and less than 2.5% by weight of HF, comprising a step (I) comprising the following steps:
A) at least one step of electrolytically producing raw $F_2$ from HF in the presence of KF
B) at least one step of removing particles entrained in the raw $F_2$ obtained in step A)
C) at least one step of filtering any remaining particles out of the $F_2$ leaving step B)
and
D) a step of delivering the $F_2$ to a buffer tank or a storage tank.

From this buffer tank or storage tank, it can be delivered according step (II) to the chamber to be cleaned.

A preferred process for the manufacture of $F_2$ which contains more than 0.1% by weight and less than 2.5% by weight of HF, comprising step (I) comprising the following steps:
A) at least one step of electrolytically producing raw $F_2$ from HF in the presence of KF
B) at least one step of removing particles entrained in the raw $F_2$ obtained in step A)
C) at least one step of filtering any remaining particles out of the $F_2$ leaving step B)
and
D) a step of delivering the $F_2$ to a buffer tank or a storage tank, wherein the $F_2$ pressure in step A) is equal to or lower than 1.1 bar (abs), preferably equal to or lower than 1.05±0.02 bar (abs), the pressure of the $F_2$ provided to the chamber to be cleaned is from equal to or greater than 0.2 bar (abs) to equal to or lower than 0.55 bar (abs), and wherein the pressure of the $F_2$ in each of the steps B) to D) is lower than the pressure of $F_2$ in the preceding step.

Preferably, the $F_2$ is not subjected to a pressurizing treatment throughout the process and method.

The $F_2$ provided by the invention, containing HF from 0.1 to 2.5% by weight is very well suited as chamber cleaning agent. An $F_2$ containing 1 to 2% by weight of HF can be manufactured technically easy (only a short contact time in the static scrubber is necessary, for example), and nevertheless very suitable as chamber cleaning agent. If it is desired to provide $F_2$ with a very low content of HF, e.g. with an HF content from equal to or greater than 0.1% by weight to equal to or lower than 0.5% by weight, it is an option to contact the $F_2$ for further HF removal between step B) and step C), especially with an adsorbent, e.g. with NaF. This complicates the process, though, without improving the suitability of the treated $F_2$ as chamber cleaning agent.

The $F_2$ which is provided according to the invention is used as chamber cleaning gas for chambers used in the manufacture of the a semiconductor, a TFT or a solar panel.

In a preferred embodiment, step (I), i.e., the electrolytic manufacture of $F_2$, purification and delivery, optionally including storage, as described above are performed on site in combination with step (II). The electrolyzer apparatus, scrubber, filter or filters and storage tank are connected through lines in this embodiment.

The method of chamber cleaning and the process of providing $F_2$ according to the invention have many advantages over the prior art. Contrary to the common belief that highly pure $F_2$, notably $F_2$ essentially free of HF, is needed for chamber cleaning, it was found that $F_2$ containing HF with a content of up to 2.5% by weight of HF is very suitable. Consequently, it is not necessary to subject $F_2$ to thorough and careful purifying operations to remove even minute amounts of HF. An added advantage is the finding that the purifying steps according to the process of the invention can be performed such that no pump or compressor is needed to subject purified $F_2$ to pressurization. The combination of both observations—simple purification with low pressure drop, and consequently, no need for pressurization—provides an economic advantage because of less energy consumption and less equipment; the latter also has technical advantages because less equipment and less treatment steps mean less incidents due to failure of apparatus, less maintenance costs and less downtime. Less apparatus, less treatment steps and a lower $F_2$ pressure also provide a higher degree of safety.

Should the disclosure of any patents, patent applications, and publications which are incorporated herein by reference conflict with the description of the present application to the extent that it may render a term unclear, the present description shall take precedence.

The following example is intended to explain the invention further without limiting it. It is performed according to the embodiment wherein the pressure in the electrolytic cell is 1.05 bar (abs).

EXAMPLE 1

Manufacture of $F_2$, its Purification and its Delivery for Chamber Cleaning

Step A). Manufacture of $F_2$

An electrolyte salt with a composition of about KF·2HF is filled into an electrolysis cell, heated to about 80-120° C. and molten therein. A voltage between 8 to 10 V is applied, and current is passed through the composition of electrolyte salt dissolved in the hydrogen fluoride. HF is introduced into the electrolytic cell in an amount corresponding to consumed HF. Raw $F_2$ under a pressure of about 1.05 bar (abs) and $H_2$ form in the respective electrode compartments. $H_2$ is passed through a water scrubber to removed entrained HF and is then released to the atmosphere.

Step B). Removal of HF and Solids

The raw $F_2$ in the anode compartment of the electrolytic cells contains HF and entrained solids (mainly electrolyte salt). The raw $F_2$ is withdrawn from the electrolytic cells at a pressure of about 1.05 bar (abs) and contacted in a static scrubber with liquid HF which has a temperature of about −80° C. Most of the solids and the major part of HF entrained in the $F_2$ are removed in the static scrubber. The $F_2$ leaving the static scrubber has an HF content of about 1% by weight, and its pressure is about 0.95 bar (abs.).

Step C): Additional Solids Removal in a Filter

The $F_2$ leaving step B) is passed through a Monel metal frit with pores having a diameter of approximately 1 µm to further reduce the solids content. The $F_2$ leaving the metal frit has a pressure of approximately 0.8 bar (abs.) and a very low content of entrained solids. The fits are plugged from time to time by filtered solids. They can be cleaned by a treatment with liquids to dissolve the solids.

Step D): Delivery to the Buffer Tank

The $F_2$ leaving the Monel filter frit in step C) still has a content of about 1% by weight of HF, but a very low solids content. It is passed into a buffer tank having an internal volume of 25 m³; four such buffer tanks are assembled. In the buffer tank, the $F_2$ is stored under a pressure of approximately 0.8 bar (abs.). If desired, a control valve can be foreseen between the Monel filter of step C) and the buffer tank; by means of the control valve, the pressure of the $F_2$ in the buffer tank can be reduced to a still lower level (e.g., it can be stored at a pressure ranging from 0.2 to 0.55 bar).

Step (II): As soon as $F_2$ is needed as chamber cleaning agent, it is provided from the buffer tank through a delivery line. It is passed through a control valve which further reduces the pressure, e.g. to 0.5 bar (abs) if the $F_2$ pressure in the buffer tank is greater than 0.5 bar (abs). The $F_2$ which finally is delivered to a chamber (used for the manufacture of photovoltaic cells) as cleaning agent has an HF content of 1% by weight and a pressure of approximately 0.5 bar (abs).

In the chamber, $F_2$ containing HF is introduced as the cleaning agent, an in-situ plasma is ignited and the cleaning agent, having a pressure of about 0.5 bar (abs), removes deposits, e.g. deposits of Si and $SiO_2$, from the walls and parts inside the chamber.

EXAMPLE 2

Manufacture of $F_2$, its Purification and its Delivery for Chamber Cleaning

Step A). Manufacture of $F_2$

An electrolyte salt with a composition of about $KF \cdot 2HF$ is filled into an electrolysis cell, heated to about 80-120° C. and molten therein. A voltage between 8 to 10 V is applied, and current is passed through the composition of electrolyte salt dissolved in the hydrogen fluoride. HF is introduced into the electrolytic cell in an amount corresponding to consumed HF. Raw $F_2$ under a pressure of about 1.05 bar (abs) and $H_2$ form in the respective electrode compartments. $H_2$ is passed through a water scrubber to removed entrained HF and is then released to the atmosphere.

Step B). Removal of Solids

The raw $F_2$ in the anode compartment of the electrolytic cells contains HF and entrained solids (mainly electrolyte salt). The raw $F_2$ is withdrawn from the electrolytic cells at a pressure of about 1.05 bar (abs) and introduced into a settling box where most of the solids entrained in the $F_2$ are removed by gravity. The $F_2$ leaving the settling box has an HF content of about 5% by weight, and its pressure is about 0.95 bar (abs.).

Step C). Final Solids Removal in a Filter

The $F_2$ leaving step B) is passed through a into a filtering device composed of a first Monel metal frit with pores having a diameter of approximately 30 μm and a second Monel metal frit with pores having a diameter of approximately 0.003 μm. The $F_2$ leaving the metal frit has a pressure of approximately 0.8 bar (abs.) and a very low content of entrained solids. The frits are plugged from time to time by filtered solids. They are cleaned by a treatment with liquid HF to dissolve the solids. The HF recovered from the washing of the fits is recovered and fed in the liquid phase to step A).

Step D): Delivery to the Buffer Tank

The $F_2$ leaving the Monel filter frit in step C) still has a content of about 5% by weight of HF, but a very low solids content. It is passed into a buffer tank having an internal volume of 25 m³; four such buffer tanks are assembled. In the buffer tank, the $F_2$ is stored under a pressure of approximately 0.8 bar (abs.). If desired, a control valve can be foreseen between the Monel filter of step C) and the buffer tank; by means of the control valve, the pressure of the $F_2$ in the buffer tank can be reduced to a still lower level (e.g., it can be stored at a pressure ranging from 0.2 to 0.55 bar).

Step (II): As soon as $F_2$ is needed as chamber cleaning agent, it is provided from the buffer tank through a delivery line. It is passed through a control valve which further reduces the pressure, e.g. to 0.5 bar (abs) if the $F_2$ pressure in the buffer tank is greater than 0.5 bar (abs). The $F_2$ which finally is delivered to a chamber (used for the manufacture of photovoltaic cells) as cleaning agent has an HF content of 5% by weight and a pressure of approximately 0.5 bar (abs).

In the chamber, $F_2$ containing HF is introduced as the cleaning agent, an in-situ plasma is ignited and the cleaning agent, having a pressure of about 0.5 bar (abs), removes deposits, e.g. deposits of Si and $SiO_2$, from the walls and parts inside the chamber.

The invention claimed is:

1. A method for the cleaning of chambers, the method comprising using $F_2$ which contains more than 0.01% by weight and less than 0.5% by weight of HF;
   wherein the applied $F_2$ is obtained in a process comprising the following steps (I) and (II):
   A step (I) comprising:
   A) at least one step of electrolytically producing raw $F_2$ from HF in the presence of KF
   B) at least one step of removing particles entrained in the raw $F_2$ obtained in step A)
   C) at least one step of filtering any remaining particles out of the $F_2$ leaving step B) by passing the $F_2$ through a filter
   and
   D) a step of providing the $F_2$ to a buffer tank or a storage tank;
   and
   A step (II) wherein $F_2$ is withdrawn from the buffer tank or storage tank and delivered to the chamber to perform at least one step of chamber cleaning;
   wherein the steps A) to D) are performed on the site of chamber cleaning;
   wherein step A) is performed in an electrolyzer, step B) is performed in a static scrubber, step C) is performed using a metallic filter, step D) is performed in a buffer tank or storage tank, and the $F_2$ leaving step D) is delivered to at least one chamber and used in the chamber in a chamber cleaning step (II), wherein the electrolyzer, the static scrubber, the metallic filter, the buffer tank or storage tank, and the at least one chamber are operably connected; and
   wherein the pressure of the $F_2$ in step B) is lower than the pressure of $F_2$ in step A), the pressure of the $F_2$ in step C) is lower than the pressure of $F_2$ in step B), the pressure of the $F_2$ in step D) is lower than the pressure of $F_2$ in step C), and the pressure of the $F_2$ in step (II) is lower than the pressure of $F_2$ in step D).

2. The method of claim 1 wherein the chamber is a CVD chamber.

3. The method of claim 1 wherein the chamber is used during the manufacture of a semiconductor, a micro-electromechanical system, TFT (flat panel display) or a solar cell for depositing at least one layer.

4. The method of claim 1 wherein the filter of step C) comprises pores having a diameter between 0.01 and 20 μm.

5. The method of claim 1 wherein the $F_2$ pressure in step A) is equal to or lower than 1.1 bar (abs).

6. The method of claim 1 wherein the $F_2$ is delivered to the chamber in step (II) at a pressure from equal to or greater than 0.2 bar (abs) to equal to or lower than 0.55 bar (abs).

7. The method of claim 1 wherein the $F_2$ is not subjected to a pressurizing treatment.

8. The method of claim 1 wherein the filter used in step C) is cleaned with liquid HF.

9. The method according to claim 8 wherein the liquid HF is recovered and fed to a step of electrolytically producing $F_2$.

* * * * *